(12) United States Patent
Snip et al.

(10) Patent No.: US 10,743,440 B2
(45) Date of Patent: Aug. 11, 2020

(54) DATA CENTER AND METHOD FOR COOLING SAID DATA CENTER

(71) Applicant: Switch Datacenter Group B.V., Amsterdam (NL)

(72) Inventors: Grzegorz Wilhelm Snip, Diemen (NL); Coenraad Arjen Binnerts, Amsterdam (NL)

(73) Assignee: Switch Datacenter Group B.V., Amsterdam (NL)

( * ) Notice: Subject to any disclaimer, the term of this patent is extended or adjusted under 35 U.S.C. 154(b) by 0 days.

(21) Appl. No.: 16/306,631

(22) PCT Filed: Jun. 6, 2017

(86) PCT No.: PCT/NL2017/050368
§ 371 (c)(1),
(2) Date: Dec. 3, 2018

(87) PCT Pub. No.: WO2017/213497
PCT Pub. Date: Dec. 14, 2017

(65) Prior Publication Data
US 2019/0159365 A1      May 23, 2019

(30) Foreign Application Priority Data

Jun. 6, 2016   (NL) ..................................... 2016901
Jan. 9, 2017   (NL) ..................................... 2018145

(51) Int. Cl.
| E04D 13/18 | (2018.01) |
| H05K 7/20 | (2006.01) |
| E04H 5/00 | (2006.01) |
| E04H 5/04 | (2006.01) |
| E04B 5/48 | (2006.01) |
| E04H 1/06 | (2006.01) |
| H05K 7/14 | (2006.01) |

(52) U.S. Cl.
CPC ........... *H05K 7/20745* (2013.01); *E04B 5/48* (2013.01); *E04H 1/06* (2013.01); *E04H 5/00* (2013.01); *E04H 5/04* (2013.01); *H05K 7/1497* (2013.01); *H05K 7/20827* (2013.01); *E04H 2005/005* (2013.01)

(58) Field of Classification Search
None
See application file for complete search history.

(56) References Cited

U.S. PATENT DOCUMENTS

2010/0144265 A1* 6/2010 Bednarcik .......... H05K 7/20745
454/184
2010/0252231 A1  10/2010 Tozer et al.
(Continued)

FOREIGN PATENT DOCUMENTS

EP       2354378 A1    8/2011
WO    2012099465 A1    7/2012

*Primary Examiner* — Basil S Katcheves
(74) *Attorney, Agent, or Firm* — The Webb Law Firm

(57) ABSTRACT

The invention relates to a data center for IT and/or telecoms equipment, especially servers, comprising a building with an intermediate floor arranged for carrying IT and/or telecoms equipment, especially servers, as well as cooling means for cooling the IT and/or telecoms equipment, especially servers, in order to counteract overheating of the IT and/or telecoms equipment, especially servers.

29 Claims, 9 Drawing Sheets

(56) References Cited

U.S. PATENT DOCUMENTS

| | | | |
|---|---|---|---|
| 2011/0189936 A1* | 8/2011 | Haspers | A47B 81/00 454/184 |
| 2013/0061624 A1 | 3/2013 | Zwinkels | |
| 2014/0038510 A1* | 2/2014 | Bailey | H05K 7/20745 454/339 |
| 2014/0123576 A1* | 5/2014 | Meyer | E04F 15/02452 52/126.6 |
| 2014/0137486 A1* | 5/2014 | Driess | E04H 5/02 52/30 |
| 2014/0298839 A1* | 10/2014 | Nagamatsu | H05K 7/20745 62/186 |
| 2014/0318036 A1* | 10/2014 | Eom | F24S 25/10 52/79.1 |
| 2014/0331582 A1* | 11/2014 | Klaba | H05K 7/20745 52/234 |
| 2014/0355203 A1* | 12/2014 | Kondo | H05K 7/20836 361/679.51 |
| 2015/0011148 A1* | 1/2015 | Zwinkels | H05K 7/20836 454/184 |
| 2015/0016056 A1* | 1/2015 | Endo | H05K 7/20745 361/679.49 |
| 2015/0230364 A1* | 8/2015 | Wands | H05K 7/20145 454/184 |
| 2015/0250077 A1* | 9/2015 | Endo | H05K 7/20745 361/679.47 |
| 2015/0257311 A1* | 9/2015 | Palmer | H05K 7/20836 700/276 |
| 2015/0305204 A1* | 10/2015 | Chang | H05K 7/1497 361/679.48 |
| 2015/0319888 A1* | 11/2015 | Hwang | H05K 7/20745 361/679.46 |
| 2015/0334878 A1* | 11/2015 | Long | H05K 7/20781 361/679.49 |
| 2016/0106008 A1 | 4/2016 | Cotton et al. | |

* cited by examiner

DATA CENTER AND METHOD FOR COOLING SAID DATA CENTER

CROSS-REFERENCE TO RELATED APPLICATIONS

This application is the United States national phase of International Application No. PCT/NL2017/050368 filed Jun. 6, 2017, and claims priority to Dutch Patent Application Nos. 2016901 and 2018145, filed Jun. 6, 2016, and Jan. 9, 2017, respectively, the disclosures of which are hereby incorporated in their entirety by reference.

BACKGROUND OF THE INVENTION

Field of the Invention

The invention relates to a data center for IT and/or telecoms equipment. The invention also relates to a method for cooling such a data center.

Description of Related Art

Data centers are generally known and usually comprise a room in which IT and/or telecoms equipment is installed, such as computer, server or network equipment. Optimal and stable temperature and air humidity in the room are important for good operation of the equipment. A good operating temperature for the equipment is usually between 18° C. and 27° C. and good air humidity is usually between 20% and 60%. Because of the heat produced by the IT and/or telecoms equipment, it is desirable to cool the room in order to maintain it at a stable temperature and air humidity. A data center is usually in operation for 24 hours a day, seven days a week, and the IT and/or telecoms equipment must consequently be cooled almost continuously. In order to cool the room it is usually provided with a raised floor, under which a cold air flow is blown. The air flow is blown into the room via openings in the floor. The warmed air flow is extracted at the top of the room, and after cooling, the cooled air flow is again blown under the raised floor. The air flow is thus circulated in the room, and the temperature of the equipment can be kept under control.

One aim of the invention is to provide an improved data center, in particular a data center in which a relatively large amount of IT and/or telecoms equipment can be installed and can be cooled relatively efficiently.

SUMMARY OF THE INVENTION

Therefore the invention provides a data center, comprising: at least one building, said building comprising one or more side walls, at least one at least partially open first intermediate floor constructed in the building, arranged for carrying IT and/or telecoms equipment, and at least one second intermediate floor constructed in the building, located under the at least partially open first intermediate floor, at least one indirect evaporative cooler being installed on this second intermediate floor, said evaporative cooler being arranged for leading a primary air flow coming from the IT and/or telecoms equipment that is to be cooled and leading, at a distance from the primary air flow to be cooled, a secondary air flow that is led via at least one inlet in the evaporative cooler and is led via at least one outlet from the evaporative cooler, wherein the primary air flow and the secondary air flow are separated by means of at least one partition wall, forming part of the evaporative cooler, wherein at least one part of a portion of the partition wall facing the secondary air flow is preferably covered with at least one hygroscopic covering, and at least one water reservoir arranged for moistening at least one part of at least one partition wall, and in particular the hygroscopic covering (if used), first air flow generating means for generating the primary air flow, so that the primary air flow is led through the at least one evaporative cooler, second air flow generating means for generating the secondary air flow, so that the secondary air flow is led through the at least one evaporative cooler, wherein a first side wall of the building is provided with at least one intake for the secondary air flow, and wherein a second side wall of the building is provided with a discharge opening for the secondary air flow. The data center according to the invention offers various advantages. An important advantage of the data center is that use is made of one or more indirect evaporative coolers arranged for the—via at least one partition wall—(indirect) exchange of heat, or at least enthalpy, between a primary air flow to be cooled and a secondary air flow. In the process, water, preferably from the hygroscopic covering (if used) (moistened by means of the water tank), will evaporate and be entrained by the secondary air flow. The required heat of evaporation will at least partially be abstracted from the at least one partition wall of the evaporative cooler, and therefore from the primary air flow, so that the primary air flow is cooled. The partition wall is of relatively thin construction and preferably has a relatively small thickness, such as a thickness less than or equal to 1 mm, in particular less than or equal to 0.5 mm, in order to make relatively efficient heat transfer possible. Generally the, preferably relatively thin, partition wall is made of plastic, although the use of other materials, such as metal, especially stainless steel, is also conceivable. The primary air flow and the secondary air flow preferably flow in countercurrent through the at least one evaporative cooler. The evaporative cooler consequently functions as an enthalpy exchanger, as well as in particular as a heat exchanger. This manner of indirect adiabatic cooling ((water) evaporative cooling) of the primary air flow is particularly efficient from the energy viewpoint, and some ten times more efficient than conventional, compressor-driven cooling, and in addition is particularly reliable because, in contrast to various conventional methods of cooling, the manner of cooling is no longer dependent on a "single point of failure (SPOF)", or single critical point. In addition, the data center, through the special positioning of the one or more evaporative coolers on the second intermediate floor (instead of on and/or outside the building), can be made relatively compact compared to alternative indirect, adiabatic coolers with a comparable capacity. Another advantage of the data center according to the invention is that the first (possibly outermost) side wall of the building is provided with an intake for the secondary air flow, and the second (possibly outermost) side wall of the building is provided with a discharge opening for the secondary air flow. The at least one intake may be provided with an air filter. In this way, the secondary air flow will be formed by an atmospheric air flow, which is drawn in from the atmosphere via the intake, optionally is filtered, and is led via the (moistened) discharge opening back into the atmosphere. The building is firmly attached to the fixed world and consequently has an immovable, permanent and stationary (immobile) character. Utilizing the side walls of the building of the data center for the supply and discharge of secondary air has the advantage that no separate provision has to be made for a secondary air flow that flows through the building, which is advantageous from the financial and logistic viewpoint, and so that the space on or above the second intermediate floor can also be used relatively efficiently (and maximally) for installing one or more evaporative coolers. Each side wall may be formed by an outermost side wall, or exterior wall, of the building. However, it is also conceivable that the first side wall and/or the second side wall may be positioned at a distance from an outermost side wall of the building. Then the first side wall and/or the second side wall will usually delimit a (partial) room surrounded by the building. It is also conceivable that the first side wall forms an outermost side wall of the building, whereas the second side wall is located at a distance from the outermost side wall of the building, or vice versa. It is, moreover, conceivable that, in the case when the first side wall is located at a distance from another side wall at least partially enclosing the first side wall, possibly an outermost side wall of the building, a distributing space (channel) for secondary air is formed between the first side wall and the aforementioned other side wall. It is, moreover, conceivable that, in the case when the second side wall is located at a distance from another side wall at least partially enclosing the second side wall, possibly an outermost side wall of the building, a collecting space (channel) for secondary air is formed between the second side wall and the aforementioned other side wall.

The configuration of the IT and/or telecoms equipment and the configuration and capacity below one or more evaporative coolers can be adapted relatively easily to the design and dimensions of the building, which provides a relatively flexible character for the data center. In addition, by using different intermediate floors for the electronic equipment and the cooling means (evaporative coolers), the capacity of the data center can be extended relatively easily in height by positioning several first intermediate floors and second intermediate floors alternately above one another. An additional advantage is that the at least one water-driven evaporative cooler is positioned under the first intermediate floor on which the equipment to be cooled is or at least may be installed, so that if there is a water leak in or near the at least one evaporative cooler, usually the equipment will not be damaged. The at least one water reservoir is preferably also positioned under the first intermediate floor, to further reduce the possibility of water damage to the equipment. Preferably the second intermediate floor is of essentially waterproof design. Because the waterproof second intermediate floor is usually also connected in waterproof fashion to the side walls of the building supporting the second intermediate floor, this prevents, or at least counteracts, movement of water, if there is a water leak, to any room located under the second intermediate floor. Although the first intermediate floor is usually arranged for carrying IT and/or telecoms equipment, it is also conceivable for the first intermediate floor to be arranged for carrying other kinds of (electronic) equipment requiring cooling. The primary air flow circulates through the data center. Moreover, the primary air flow usually flows from a relatively hot zone above the first intermediate floor, formed by a zone behind the equipment to be cooled, in the downward direction and will be led via the open first intermediate floor into at least one evaporative cooler below, wherein the primary air flow, after flowing through the at least one evaporative cooler, flows in the upward direction and is blown via the open first intermediate floor into a relatively cold zone above the first intermediate floor. The cold zone is, moreover, usually formed by the front of the equipment. The first intermediate floor is also designated as the computer floor. The first intermediate floor is usually provided with one or more gratings, through which the primary air flow can pass. Although the primary air flow undergoes an essentially vertically oriented circulation in the data center, the secondary air flow will usually follow an essentially horizontal (and noncirculating) path through the data center.

Water that comes into contact with the secondary air flow will usually be evaporated under essentially atmospheric conditions. Consequently the evaporative coolers will not comprise a compressor and/or be connected to a compressor. The water to be evaporated is sprayed, trickled, or otherwise supplied, from a water reservoir, such as a water pipe and/or buffer tank, preferably by means of one or more sprinklers (spray nozzles), usually above at least one partition wall and/or on a top section of the at least one partition wall, after which the (not yet evaporated) water will move under the effect of gravity in the downward direction (in the direction of the second intermediate floor below). The water may be supplied at a horizontal and/or vertical distance from the evaporative cooler. Preferably the water supplied trickles or flows as a film via the at least one partition wall in the downward direction. Application of the hygroscopic covering on the partition wall may be advantageous to allow a larger amount of water to flow in a more controlled, usually delayed, manner along or over the partition wall, which will usually be beneficial for the cooling capacity of the evaporative cooler.

Preferably the inlet of the at least one evaporative cooler is arranged for leading the secondary air flow into the evaporative cooler positioned at a distance from the intake provided in the first side wall of the building. Although it is conceivable to connect the inlet of the evaporative cooler by means of a tube, hose or pipe to the intake, it is usually preferable not to employ such a connection. This provides, between the inlet of the at least one evaporative cooler and the intake provided in the first side wall of the building, an essentially closed distributing space for the secondary air flow to be led through the at least one evaporative cooler. The collecting space is partly delimited by at least one side wall of the building, partly by the at least one evaporative cooler, and possibly also partly by other delimiting elements in the building, such as one or more interior walls constructed in the building. Through application of the distributing space, the secondary air drawn in via the intake in the first side wall is distributed over the room, so that more efficient input of the secondary air into the at least one evaporative cooler may be achieved. Although it is conceivable that the second intermediate floor is only provided with one evaporative cooler, which may for example be elongated (and relatively large), it is usually preferred for several evaporative coolers to be provided on the second intermediate floor. Application of the distributing space (or collecting space) for secondary air is in this case particularly advantageous, for a better guarantee that secondary air is also led through evaporative coolers which, compared to one or more other evaporative coolers, are located at a greater distance from the intake provided in the first side wall. This may provide relatively balanced cooling of the data center.

Several indirect evaporative coolers may be employed on the second intermediate floor. These evaporative coolers may be installed in various ways on the second intermediate floor. It is for example conceivable to provide the inlet for secondary air of each evaporative cooler at the front facing the intake provided in the first side wall. Instead of this frontal orientation, it is also conceivable, and usually relatively advantageous, if the evaporative coolers are oriented transversely (perpendicularly), or at some other angle, relative to the intake(s) provided in the first side wall. In this transverse orientation, the inlet of each evaporative cooler is oriented transversely relative to the intake(s). The evaporative coolers are preferably installed parallel (side by side). With this parallel orientation, in which the evaporative coolers are preferably positioned against each other in order to minimize the space between the evaporative coolers, the secondary air will usually also be led parallel and simultaneously through the evaporative coolers. A consequence of transverse orientation of the one or more evaporative coolers relative to the intake(s) provided in the first side wall is that the secondary air will flow along a nonlinear path in the data center, which is usually beneficial for efficient cooling of the primary air flow. In addition, having the secondary air flow follow a nonlinear path (in the distributing space) usually has the advantage that any large differences in velocity in the secondary air flow in or near the intake provided in the first side wall can be attenuated in the distributing space, which is beneficial for balanced supply of secondary air into the one or more evaporative coolers. Furthermore, this transverse orientation increases the flexibility in the number of parallel oriented evaporative coolers to be employed, especially if the second intermediate floor is of rectangular configuration and the intake and discharge opening provided in the building are positioned above the end faces of the second intermediate floor.

It is usually advantageous if the outlet of the at least one evaporative cooler arranged for directing the secondary air flow from the evaporative cooler is positioned at a distance from the discharge opening provided in the second side wall of the building. This distance on the one hand increases the flexibility in the placement of the one or more evaporative coolers on the second intermediate floor, and on the other hand also makes it possible to form an essentially closed collecting space between the outlet of the at least one evaporative cooler and the discharge opening provided in the second side wall of the building. The collecting space is arranged for passage of the (moistened) secondary air flow that is led through the at least one evaporative cooler. The distributing space (if used) and the collecting space (if used) are preferably separated from one another, more preferably by means of one or more partition walls and/or separating components of some other kind. However, it may be particularly advantageous if at least one partition wall, which separates the distributing space and the collecting space from one another, is provided with at least one control valve for mixing the air derived from the collecting space with the air present in the distributing space. This mixing is particularly favorable if relatively cold secondary air (air from the surroundings), with a temperature below 0° C., is led into the distributing space, in order to allow the temperature of this secondary air to rise (somewhat), to a temperature above 0° C., before the secondary air flow is led through the one or more (water-driven) evaporative coolers. This prevents freezing of the evaporative coolers, especially the moistened hygroscopic covering thereof, so that a correct enthalpy-exchange effect of the evaporative cooler(s) can be guaranteed. It is conceivable, and even advantageous, if a collecting space for the secondary air flow led through at least one evaporative cooler is provided under the second intermediate floor, with the second intermediate floor communicating with the collecting space below. By positioning at least a part of the collecting space under the second intermediate floor, the overall dimensions of the building, especially the footprint of the building, can be kept as small as possible, which is advantageous from the financial and economic viewpoint. The collecting space located under the second intermediate floor may be delimited on an underside by a third intermediate floor. Opposite sides of the collecting space located under the second intermediate floor are usually delimited by side walls of the building. The second intermediate floor may optionally be provided with one or more passages for providing communication between the second intermediate floor and the collecting space below.

The primary air flow is preferably generated by employing first air flow generating means, which form part of the data center. The secondary air flow is preferably (also) generated by employing second air flow generating means, which form part of the data center. Usually the air flow generating means comprise one or more fans. It is conceivable for one or more fans to form part of each evaporative cooler. It is conceivable for one or more fans to be located in the space above the first intermediate floor and under an upper partition, formed by an upper floor or upper ceiling, and this space may also be designated as the first story room. It is also conceivable for one or more fans to be located in the space above the second intermediate floor and under an upper first intermediate floor, and this space is also designated as the second story room. It is conceivable for one or more fans to be provided in the first intermediate floor. Furthermore, it is conceivable for the one or more fans to be fitted in place of the intake provided in the first side wall and/or in place of the discharge opening provided in the second side wall. The height of the first story room and second story room is preferably greater than 2 meters, more preferably greater than 2.5 meters, so that there is sufficient space for people to walk on the intermediate floors. Usually the flow rate of the secondary air flow will be less than the flow rate of the primary air flow. The flow rate of the secondary air flow is preferably less than or equal to half the flow rate of the primary air flow. The total flow rate of the secondary air flow led through each evaporative cooler is usually less than 100 000 $m^3$ per hour.

The hygroscopic covering of the at least one evaporative cooler is preferably formed by a layer of hygroscopic material, especially a hygroscopic cloth, more especially a hygroscopic nonwoven (also designated as fleece) and/or a hygroscopic woven fabric. Preferably the layer of material lies essentially loose against the contact side of the partition wall, so that the film of water can spread unhindered over essentially the whole contact side of the partition wall. Thus, heat can be transferred optimally and unhindered at every location of the partition wall. Since mostly a final temperature is set for warming or cooling as a boundary condition, the residence time of the primary air flow in the enthalpy exchanger can be reduced considerably, on account of the relatively high energy efficiency. To prevent the layer of material coming away from the partition wall, the layer of material is preferably fixed to the partition wall, especially to a side of the partition wall other than the contact sides, so that hampering of heat transfer between the two media is prevented. In a preferred embodiment the layer of material is stretched over the contact side of the partition wall. This stretched state of the layer of material will in particular arise after moistening the layer of material, since the layer of material will mostly be formed by a cloth and/or a fleece that shrinks on moistening. The advantage of stretching the layer of material over the contact side of the partition wall is that a permanent, solid and stable connection of the layer of material on the partition wall can be guaranteed, so that heat transfer can be of a uniform and permanent nature over the whole partition wall. In another preferred embodiment the layer of material envelops the partition wall on both sides. For this, the layer of material can cover the partition wall as an endless sleeve. The advantage of such a sleeve is that no chemical and/or mechanical fixing means are required at all to fix the mutual orientation between the partition wall and the layer of material. In yet another preferred embodiment the partition wall forms at least one channel around which the layer of material is applied. The channel is arranged for passage of the primary air flow. The layer of material is applied against an exterior peripheral side of the channel. In this preferred embodiment the partition wall may be formed by a tube or pipe that is covered at least partially by the layer of material. However, the partition wall may also be configured as a channel structure provided with several channels for passage of the primary air flow. The hygroscopic covering of the at least one evaporative cooler is preferably formed by a layer of material, especially a cloth, more especially a nonwoven and/or a woven fabric. Preferably the layer of hygroscopic material (or covering of some other kind) lies essentially loosely against the contact side of the partition wall of the evaporative cooler, so that a film of water can spread unhindered over essentially the whole contact side of the partition wall. In this way, heat can be transferred relatively unhindered at every location of the partition wall.

The first intermediate floor is of at least partially open configuration. This signifies that the first intermediate floor is arranged for the passage of air, and especially passage of the primary air flow, both a part of the primary air flow that is to be cooled and a cooled part of the primary air flow. This open first intermediate floor may be achieved relatively easily by employing one or more gratings as (component of the) first intermediate floor. The first intermediate floor is also designated as the computer floor.

As already stated, at least one part of the water reservoir is preferably formed by a water pipe. Usually each evaporative cooler will also comprise its own evaporative cooler water reservoir, arranged to keep containers supplied and for, preferably metered, delivery of water to the hygroscopic covering of the evaporative cooler. The water pipe (if used) is then preferably arranged for supplying the evaporative cooler water reservoir with water.

Preferably (standardized) server racks or alternative carrying structures are mounted on the one or more first intermediate floors of the data center, wherein each server rack is arranged for carrying IT and/or telecoms equipment. Usually the server racks are positioned in overhead rows, between which a cold zone is formed, and wherein a warm zone is formed behind each row of server racks. Usually each evaporative cooler will be arranged for cooling at least two, preferably at least four server racks located above the associated evaporative cooler, and in particular the equipment carried by the server racks. The server racks, also called data racks, usually have a typical width of 60 centimeters and a typical depth of 120 cm, wherein cooling with 12.5 kW is usually sufficient to cool the server rack. If an evaporative cooler with a cooling capacity of approx. 50 kW is used, four overhead server racks can be cooled.

If the data center comprises several buildings that are positioned a mutual distance apart, then it is advantageous for the second side wall of one building to be located opposite the second side wall of another building. In this way the outlets for the (moistened) secondary air flow of both buildings face one other, preventing mixing of a moistened secondary air flow with an (unmoistened/unused) secondary air flow yet to be drawn in via the intake of the first side wall, which is beneficial for the efficiency of the cooling of the entire data center. The second side walls of the opposite buildings, facing one another, then form de facto a discharge sluice or discharge zone for moistened and used secondary air.

The invention also relates to a method for cooling a data center as claimed in one of the preceding claims, wherein the method comprises the steps: A) leading a secondary air flow via at least one intake provided in the first side wall of a building of the data center into a space above the second intermediate floor of the data center, B) leading the secondary air flow through at least one indirect evaporative cooler, and along at least one, preferably moistened, partition wall, and preferably leading the air flow along a moistened hygroscopic covering applied against at least one partition wall, of the at least one evaporative cooler, C) discharging the secondary air flow moistened during step B) via at least one discharge opening provided in the second side wall of a building of the data center, D) discharging the primary air to be cooled, which is located above the first intermediate floor, and behind IT and/or telecoms equipment placed thereon, via the first intermediate floor located above the second intermediate floor, E) leading the primary air flow through the at least one indirect evaporative cooler, and along a side, turned away from the secondary air flow, of the at least one, preferably moistened, partition wall of the at least one evaporative cooler, wherein the primary air flow is cooled, F) returning the cooled primary air flow via the first intermediate floor to a front of the IT and/or telecoms equipment, wherein steps B) and E)—at least for a period—are carried out simultaneously.

Preferably the method also comprises step G), comprising moistening the hygroscopic covering of each evaporative cooler by means of at least one water reservoir, wherein step G) is carried out before and/or during step B). Advantages of the method have already been described in detail in the foregoing.

BRIEF DESCRIPTION OF THE DRAWINGS

The present invention will be explained further on the basis of the nonlimiting embodiment examples presented in the following figures. These show.

DESCRIPTION OF THE INVENTION

Figure 1:
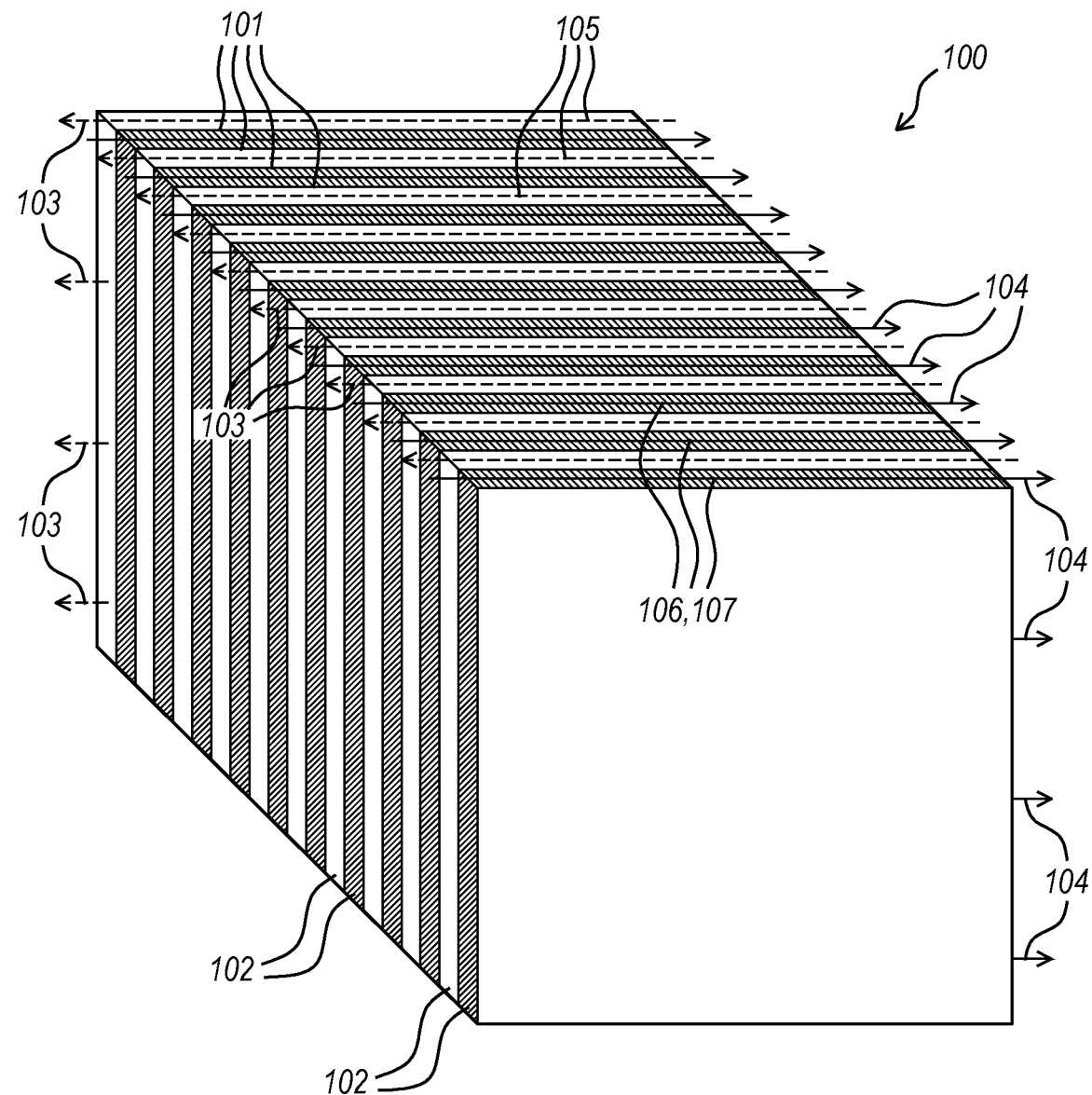
FIG. 1: a schematic representation of an enthalpy-exchanging unit as applied in an evaporative cooler for use in a data center according to the invention.

FIG. 1 shows a schematic representation of an enthalpy-exchanging unit 100 as applied in an indirect evaporative cooler for use in a data center according to the invention. The enthalpy-exchanging unit 100 comprises several partition walls 101 installed parallel to one other, which form channels 102 for conveying a primary or a secondary air flow (103, 104). The primary air flow 103 conveys hot air derived from a room to be cooled, said room comprising IT and/or telecoms equipment, through the enthalpy-exchanging unit 100, where the air cools down. Moreover, the primary air flow 103 conveys the cooled air back to the room to be cooled. The secondary air flow 104, which is also led through the enthalpy-exchanging unit 100, functions as a process air flow for evaporating the water supplied to the enthalpy-exchanging unit 100. The primary and secondary air flows 103, 104 are led along a first contact side 105 or a second contact side 106, respectively, of the partition walls 101 of the enthalpy-exchanging unit 100, with exchange of enthalpy. Preferably the primary and secondary air flows 103, 104 are led in opposite directions to one another along the respective contact sides 105, 106 of the partition walls 101. However, it is also conceivable for the directions of the primary and secondary air flows 103, 104 to have some other mutual orientation. The partition walls 101 are installed in such a way that the first contact side 105 and the second contact side 106 of a partition wall 101 are turned toward a first contact side 105 or a second contact side 106, respectively, of an adjacent, parallel partition wall 101. This gives rise to a set of parallel channels 102 that are surrounded alternately by only first contact sides 105 or second contact sides 106 of adjacent partition walls 101. The second contact sides 106 of the partition walls 101 are each provided with a hygroscopic covering 107 that is connected to this second contact side 106. Moreover, it is also possible that only one of two second contact sides 106 turned toward each other, of adjacent partition walls 101 of the enthalpy-exchanging unit 100, is provided with said hygroscopic covering 107. In order to acquire its hygroscopic properties, the hygroscopic covering 107 may (partly) be manufactured from a hygroscopic nonwoven and/or a hygroscopic woven fabric. The hygroscopic covering 107 is preferably moistened from the top with water or another suitable liquid coolant from a water reservoir by means of a moistening device (see FIG. 2b), so that a film of water forms between the hygroscopic covering 107 and the second contact side 106 of the partition wall 101. To guarantee a continuous supply of water, the water reservoir may be supplied with water by means of a water pipe (see FIG. 2b). On conveying the secondary air flow 104 along the moistened hygroscopic covering 107, evaporation of the water takes place, wherein the heat required for this evaporation is abstracted from the surroundings and the partition wall 101 cools down. The primary air flow 103, which is in heat exchanging contact with the first contact side 105 of the partition wall 101, will thus also be cooled on passing through the partition wall. Through separation of the primary air flow 103 and the secondary air flow 104, the evaporated moisture arising in the secondary air flow 104 will not be given up to the primary air flow 103.

Figure 2:
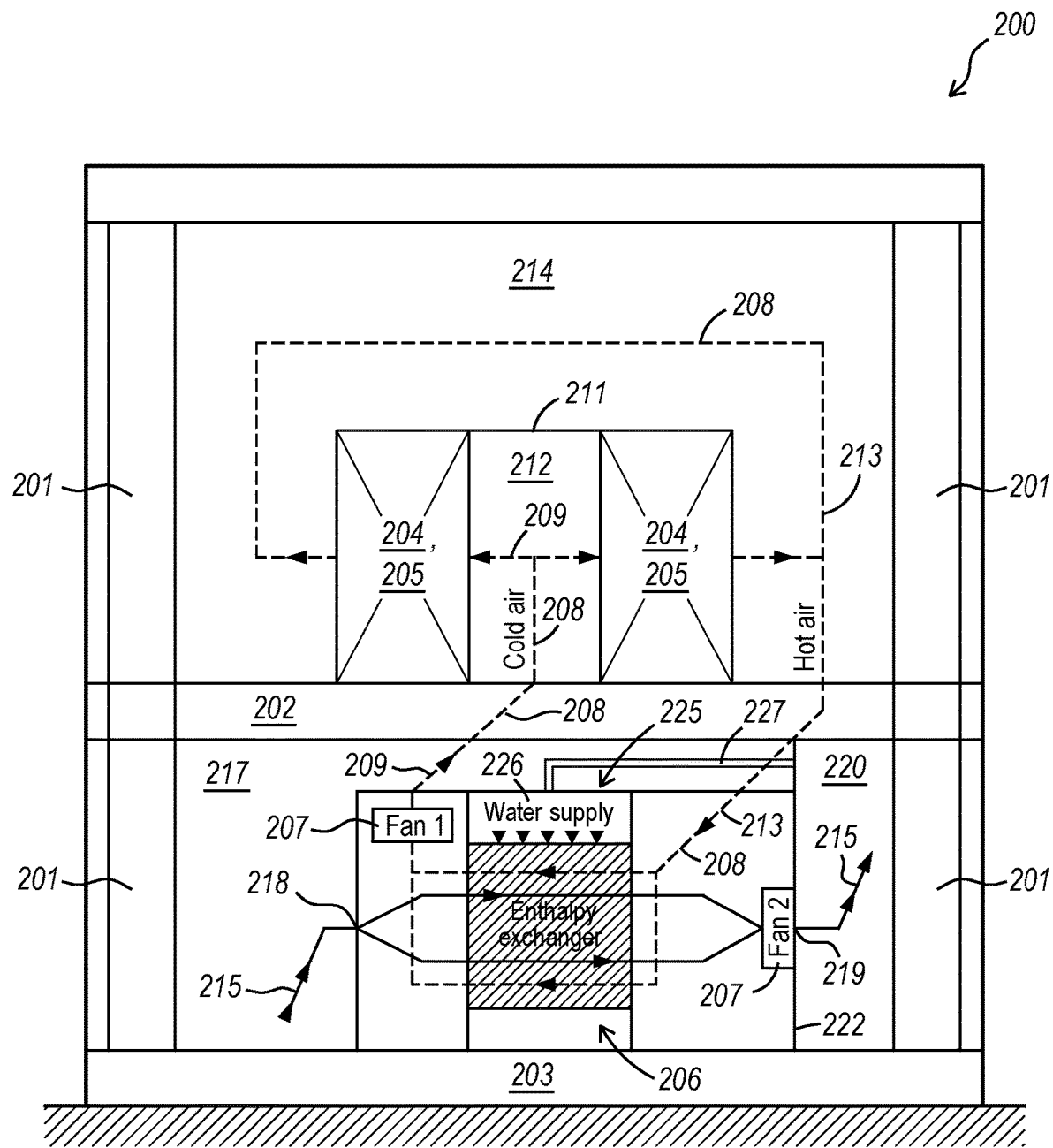
FIG. 2: a schematic side view of a data center according to the invention.

FIG. 2 shows a schematic side view of a part of a data center 200 according to the invention. The data center 200 shown comprises several side walls 201, a first intermediate floor 202 and a second intermediate floor 203 located under the first intermediate floor. The first intermediate floor 202 is arranged for carrying IT and/or telecoms equipment 204 and for this purpose may be provided with carrying structures such as server racks 205. The second intermediate floor 203, which is preferably of waterproof construction, is arranged for carrying one or more evaporative coolers 206. Each evaporative cooler 206 is arranged for cooling the IT and/or telecoms equipment 204 located above, on the first intermediate floor 202. For this purpose, a primary air flow 208 is created by means of one or more fans 207 and is conveyed by the air 209 cooled by the evaporative cooler 206 (the air for example being cooled to a temperature of around 24° C.) through an air channel 228 and via a grating 210 provided in the first intermediate floor 202 to the front of the server racks 205. It is also possible for other air flow generating means to be used for generating an air flow. The fronts of the server racks 205 are connected to their top via a covering element 211, so that a cold zone 212 arises, enclosed between the covering element 211, the first intermediate floor 202 and the server racks 205. Moreover, with several server racks 205 placed behind one another, a cold zone 212 will arise in the form of a cold passage. Through use of the covering element 211, the cooled air 209 can only leave the cold zone 212 through the server racks 205, so that a cold air flow is guaranteed along the IT and/or telecoms equipment 204 placed in the server rack. The air 213 warmed by the IT and/or telecoms equipment 204 (wherein the air is warmed for example to a temperature of about 36° C.) then arrives in a warm zone 214 located behind the server racks 205, from where the primary air flow 208 conveys the warmed air 213 via another grating 210 provided in the first intermediate floor 202 back to the evaporative cooler 206. In order to achieve indirect cooling of the primary air flow 208 flowing through the evaporative cooler 206, a secondary (process) air flow 215 is created by one or more fans 207 (see FIG. 2b). This secondary air flow 215 conveys outside air through an intake provided in a side wall (not shown) of the data center to an essentially closed first distributing space 217. From there, the secondary air flow 215 is led via an inlet 218 of the evaporative cooler 206 in a mainly horizontal direction through the evaporative cooler 206. During this, the secondary air flow 215 remains separated from the primary air flow 208. After enthalpy exchange in the evaporative cooler 206, the air leaves the evaporative cooler 206 via an outlet 219, and ends up in an essentially closed second distributing space 220. The secondary air flow 215 finally leaves the second distributing space 220, and therefore the data center 200, via an outlet (not shown) provided in an upper side wall of the data center. The first distributing space 217 and the second distributing space 220 are separated from one another by a partition wall 222. The partition wall 222 may be provided with a controllable passage 223, such as a control valve or closable grating, for mixing the air from the second distributing space 220 with the air present in the first distributing space 217. The partition wall 222 may moreover be provided with a door 224, creating a passage between the first and second distributing space 217, 220. As is also shown in FIG. 2, in order to ensure efficient operation of the evaporative cooler 206, on an upper side of the evaporative cooler 206, water is supplied to the evaporative cooler 206 in order to moisten the hygroscopic covering in the evaporative cooler 206. Moistening takes place by means of a moistening device 225, comprising a water reservoir 226, which is provided on the top of the evaporative cooler 206. The water reservoir 226 is preferably connected to or provided with one or more spray nozzles for moistening the partition wall, or at least moistening the secondary air flow. To guarantee a continuous supply of water, the water reservoir 226 is supplied with water by means of a water pipe 227.

Figure 3A:
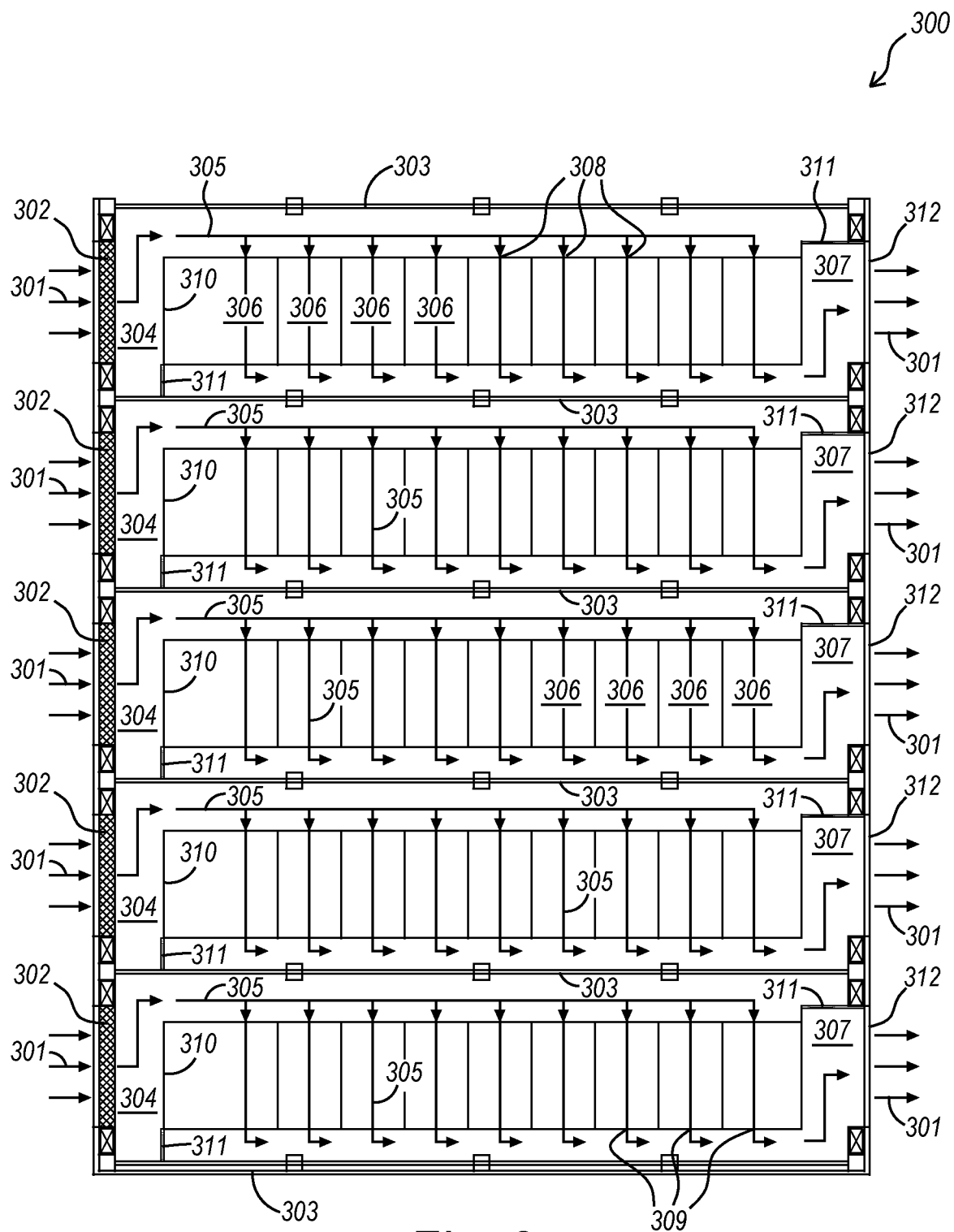
FIG. 3*a*: a top view of a second intermediate floor of a data center according to the invention in a first operational configuration.

FIG. 3a shows a top view of a second intermediate floor of a data center 300 according to the invention in a first operational configuration. In the first operational configuration, outside air 301 comes into a distributing space 304 via an intake 302 in a side wall 303 of the data center 300. From there, the outside air 301 is led as secondary air flow 305 through an evaporative cooler 306, after which it ends up in a collecting space 307. As can be seen from FIG. 3a (and FIG. 3b), the secondary air flow 305 follows a nonlinear path, wherein the direction of flow of the secondary air flow 305 in the distributing space 304 and the respective inlets 308 of the evaporative cooler(s) 306 together enclose an angle, and specifically a right angle. In the same way, the direction of flow of the secondary air flow 305 in the collecting space 307 and the respective outlets 309 of the evaporative cooler(s) 306 together enclose an angle, and specifically a right angle. In the arrangement shown, for the sake of extendability, several adjacent, parallel-connected evaporative coolers 306 are installed. However, it is also possible to employ a single evaporative cooler 306 (generally with a width that occupies a large part of the width of the building). The first and collecting spaces 304, 307 are separated from one another by a partition wall 310. The partition wall 310 also comprises a controllable passage 311, which is closed in the first operational configuration. As a result, air in the distributing space 304 cannot mix with air from the collecting space 307. From the collecting space 307, the air is discharged via a discharge opening 312 in another side wall 303 of the data center 300 to the outside air 301. This first operational configuration is advantageous in summer conditions, wherein the outside air 301 and therefore the secondary air flow 305 entering the evaporative cooler 306 is drier than the secondary air flow 305 leaving the evaporative cooler 306. In typical summer conditions, outside air 301, which flows inside the distributing space 304 with a temperature of about 35° C. and with a relative air humidity of about 25%, after passing through the evaporative cooler 306, will have a temperature of about 30° C. and a relative air humidity of about 90%.

Figure 3B:
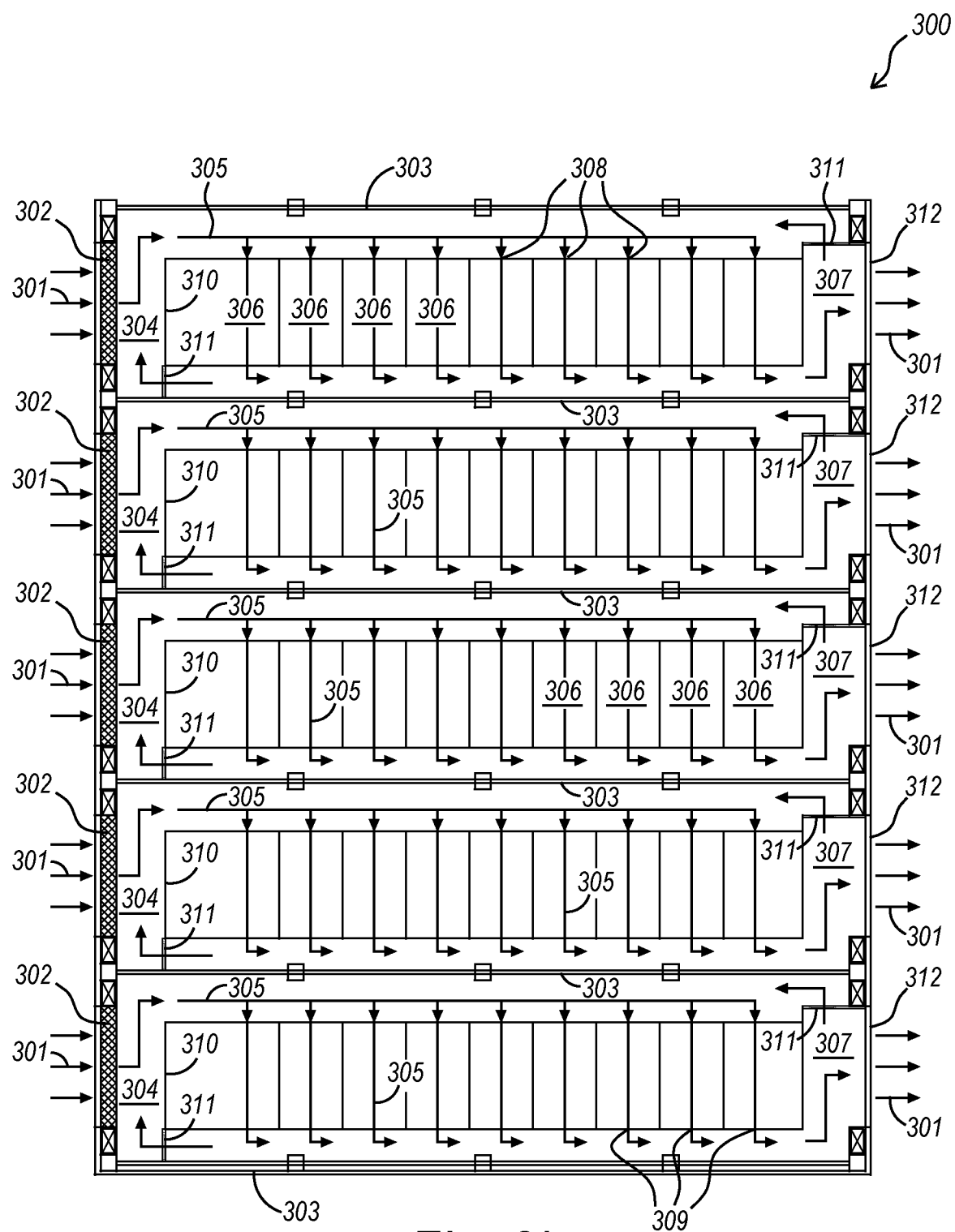
FIG. 3*b*: a top view of the second intermediate floor of a data center according to the invention shown in FIG. 3*a* in a second operational configuration.

FIG. 3b shows a top view of the second intermediate floor of a data center 300 according to the invention shown in FIG. 3a, in a second operational configuration. Once again, corresponding reference numbers refer to corresponding components. The second operational configuration differs from the first operational configuration in that the controllable passage 311 is opened at least partially. As a result, air in the distributing space 304 is now able to mix with air from the collecting space 307. This second operational configuration is advantageous in winter conditions, in order to warm secondary air (somewhat) by the evaporative cooler 306 before it is led through the evaporative cooler 306, to prevent freezing of the components of the data center, especially the evaporative cooler 306. In typical winter conditions, outside air 301, which flows inside the distributing space 304 with a temperature for example of about −20° C. and with a relative air humidity of about 95%, after passing through the evaporative cooler 306, will have a temperature of about 34° C. and a relative air humidity of about 3%. Moreover, with such low temperatures of the secondary air flow, application of water is not required (per se) in the evaporative cooler to be able to achieve sufficient cooling of the primary air flow.

Figure 4A:
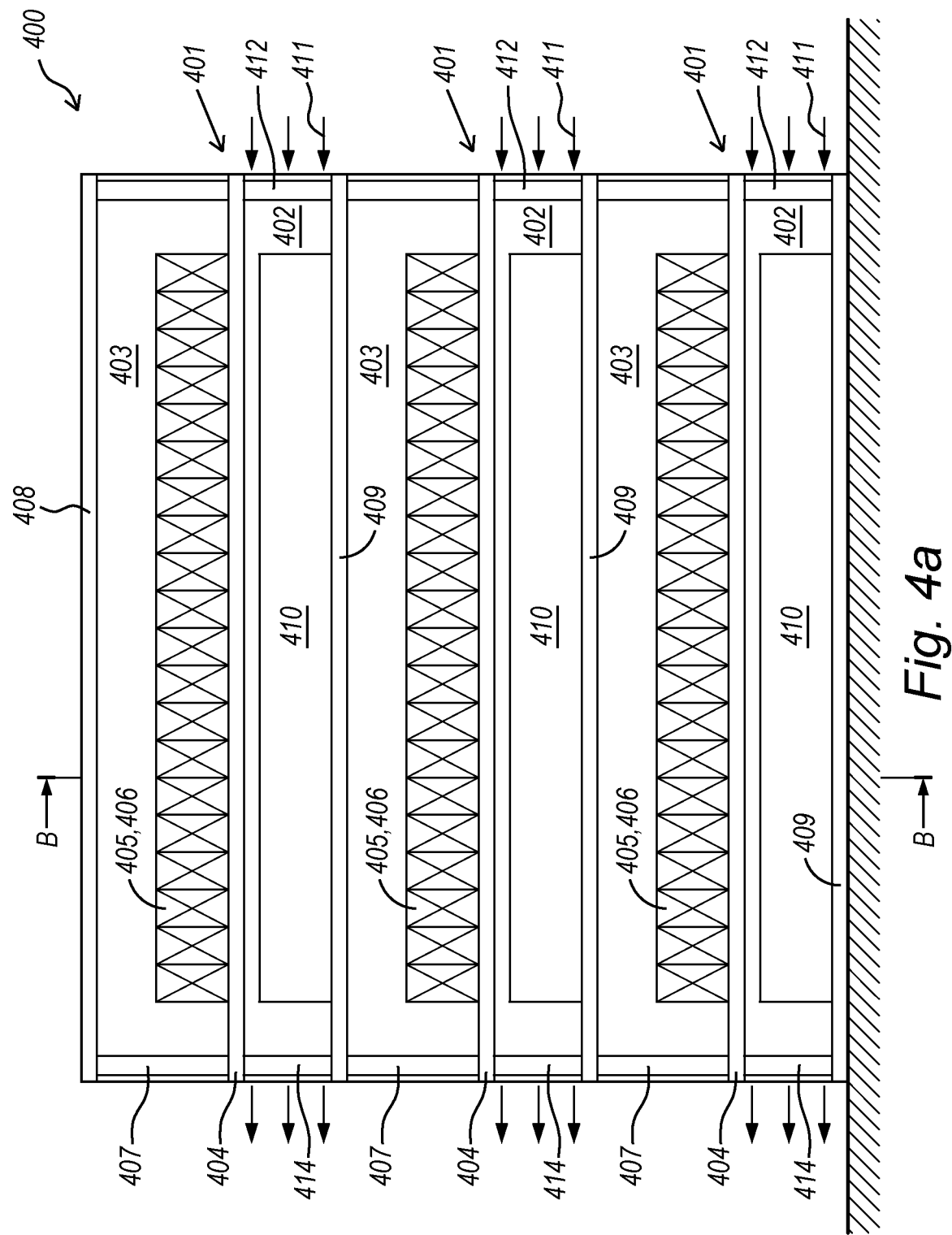
FIG. 4*a*: a cross section of a data center according to the invention.
Figure 4B:
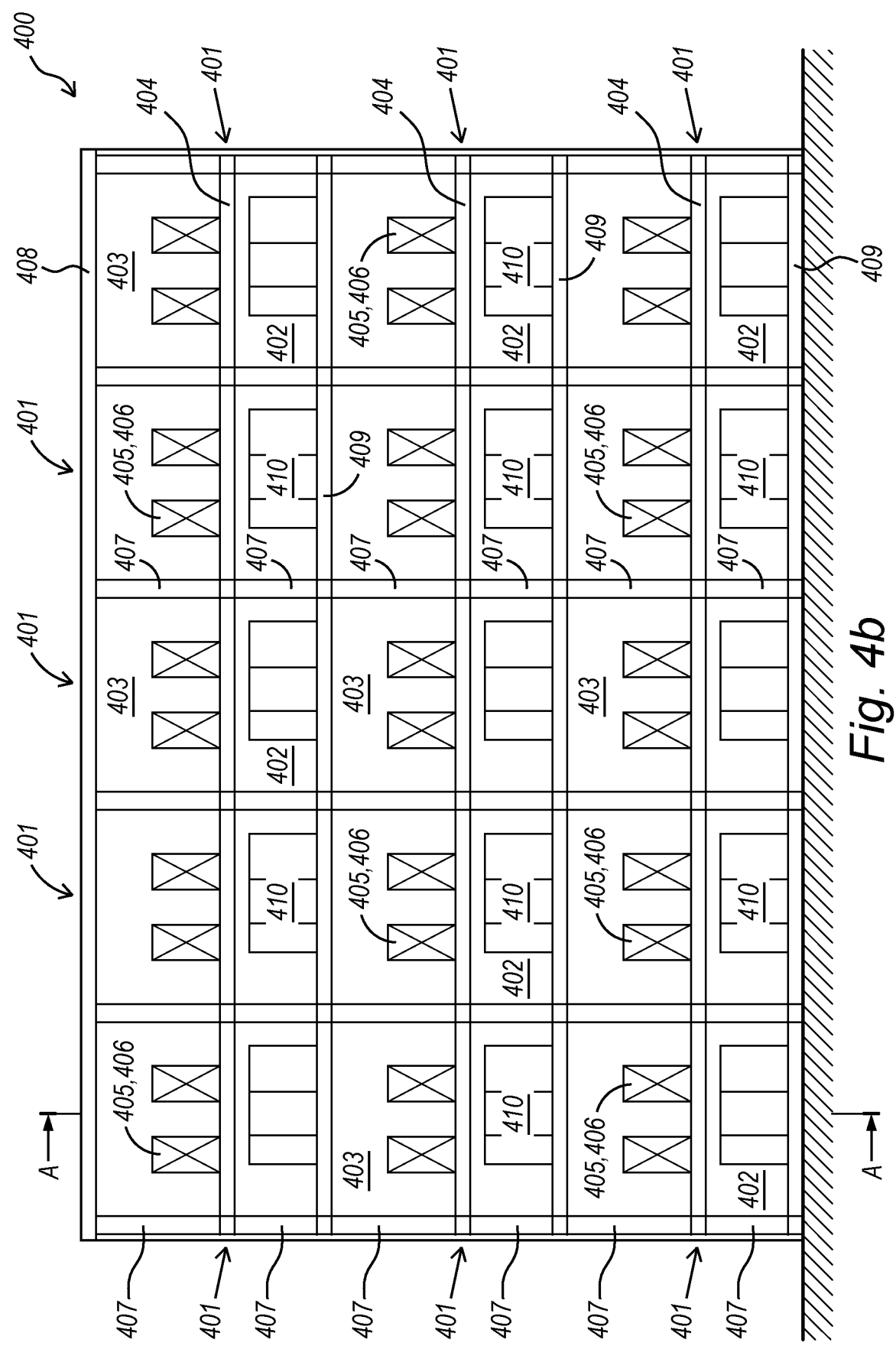
FIG. 4*b*: another cross section of a data center according to the invention.

FIG. 4a shows a cross section of a data center 400 according to the invention transversely along line A-A as shown in FIG. 4b. In the configuration shown, the data center 400 comprises three sections 401 placed above one another, each of which comprises a cooling space 402 and a cooled space 403. The cooled space 403 comprises a first intermediate floor 404 for carrying IT and/or telecoms equipment 406 placed in server racks 405. The cooled space 403 also comprises a number of side walls 407 connected to the first intermediate floor 404, which in their turn support a roof 408 or second intermediate floor 409 of an upper section 401. The cooling space 402 of each section 401 is located directly beneath the cooled space 403 of the same section and comprises a second intermediate floor 409 for carrying one or more evaporative coolers 410. The cooling space 402 also comprises a number of side walls 407 supported on the second intermediate floor 409, which in their turn support the first intermediate floor 404 of the relevant section 401. Outside air 411 is supplied at a first side wall 407 of the data center 400 via an associated intake 412 to a cooling space 402. This air is then led as secondary air flow (process air flow, not shown) through the evaporative cooler 410 and then leaves the cooling space 402 via an associated discharge opening 414 in a second side wall 407 of the data center 400 opposite the aforementioned first side wall 407 of the data center 400. The configuration shown is easy to adjust or extend both in the direction of height and transversely. Transversely, the width of the evaporative cooler 410 can be adapted to the width of the data center 400. It is advantageous to employ several adjacently installed, parallel-connected evaporative coolers 410, with which individual evaporative coolers 410 may be added or removed as required, depending on the desired width of the data center 400. In the same way, server racks 405 may be added or removed in the transverse direction in the cooled space 403. Because each section 401 forms an independently operating system, a desired height of the data center 400 can easily be selected by stacking several sections 401 on one another.

FIG. 4b shows another cross section of a data center 400 according to the invention in the longitudinal direction along line B-B as shown in FIG. 4a, wherein corresponding reference numbers refer to corresponding components. The data center 400 comprises several sections 401 adjacent to one another in the height direction and in the longitudinal direction, each comprising a cooled space 403 with IT and/or telecoms equipment 406 and a cooling space 402 with one or more evaporative coolers 410. By adding or removing sections 401 in the height direction and/or in the longitudinal direction, it is easy to increase or reduce the size of the data center 400.

Figure 5:
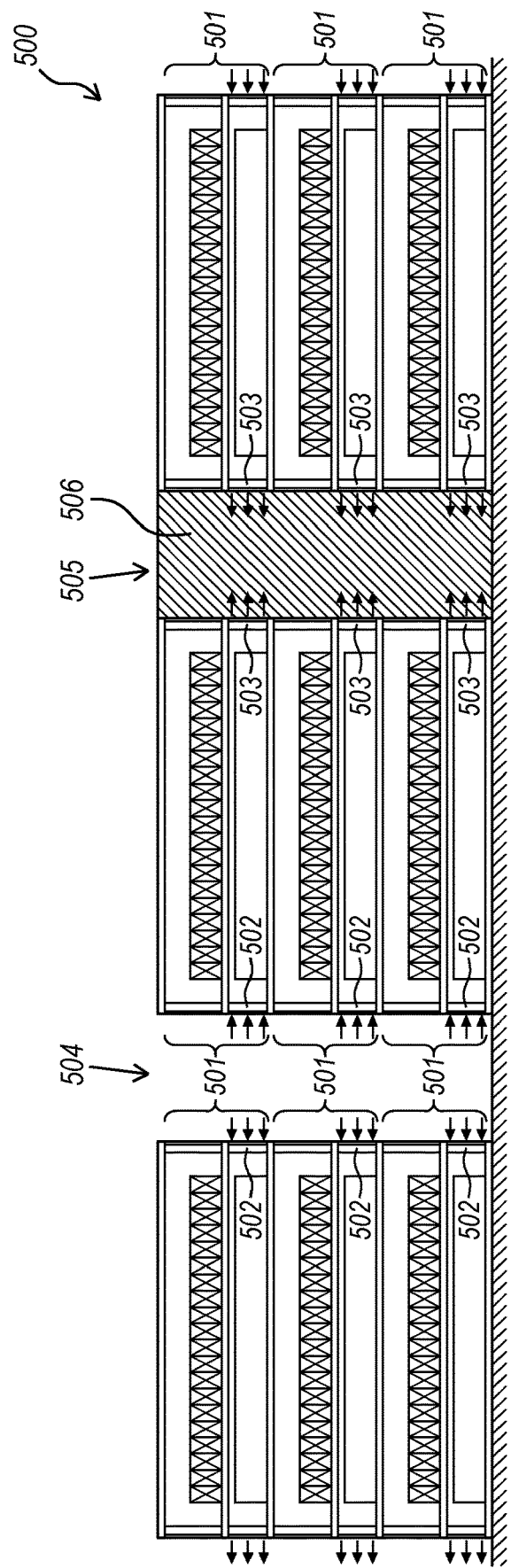
FIG. 5: a view of an assembly of several data centers according to the invention.

FIG. 5 shows a view of an assembly of several data centers 500 according to the invention. In the configuration shown, each data center 500 comprises three sections 501 stacked on one another in the height direction. Each section 501 further comprises an assembly of a first intermediate floor for IT and/or telecoms equipment and an underlying second intermediate floor provided with one or more evaporative coolers, as already described in the foregoing, in particular in the description of FIG. 2. The sections 501 of the individual data centers 500 are oriented with respect to one another in such a way that the intakes 502 are incorporated on the same side of the data center 500. The discharge openings 503 are also incorporated on one and the same side of the data center 500, opposite the side of the data center 500 that comprises the intakes 502. Moreover, the individual data centers 500 are oriented with respect to one another in such a way that the side with the intakes 502 or the side with the discharge openings 503, respectively, of adjacent data centers 500 face one another. As a result, passages are formed alternately between the data centers 500 for the supply of secondary air (process air) 504 or the discharge of secondary air 505, wherein the different air flows remain separate from one another as far as possible. For more controlled conveyance of the secondary air, it is advantageous if a(n) (additional) vertical wall 506 is provided between the buildings 500.

Figure 6:
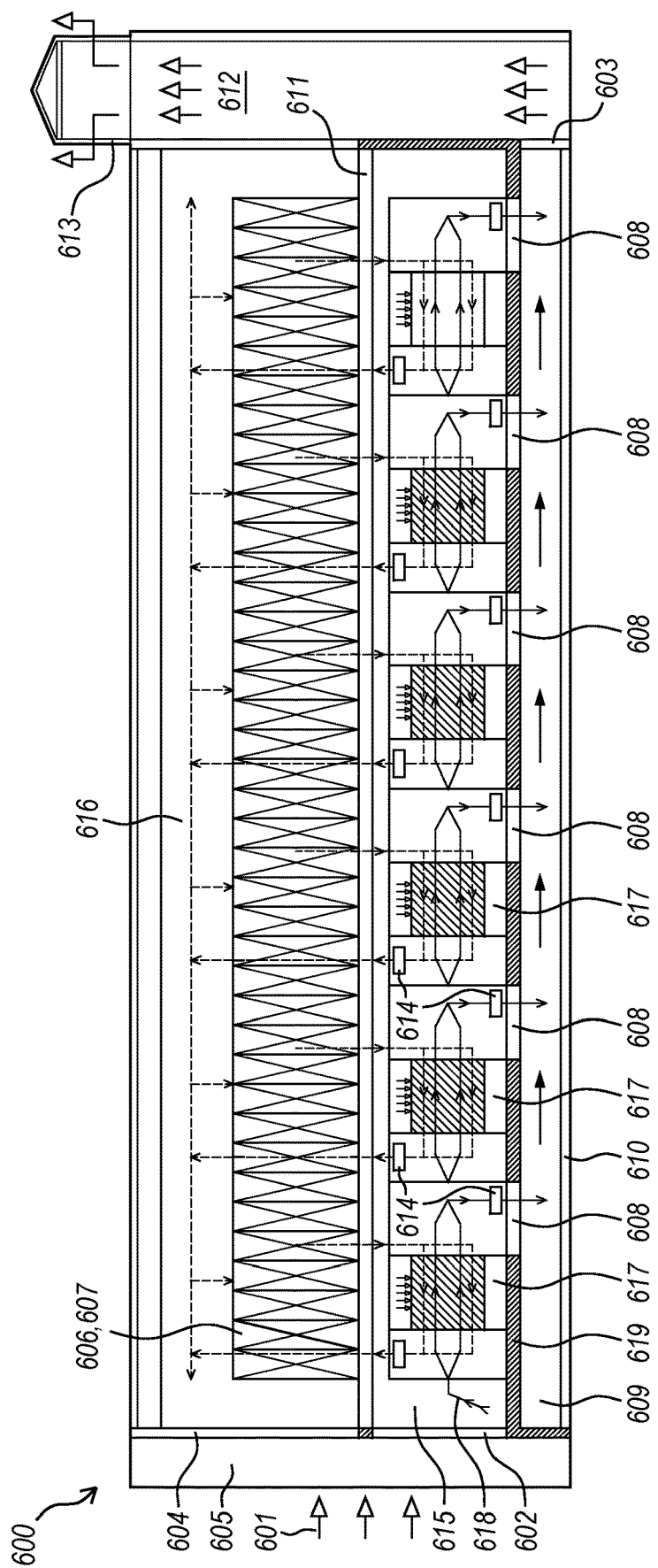
FIG. 6: a cross section of another data center according to the invention.

FIG. 6 shows a transverse cross section of a possible embodiment of a data center 600 according to the invention. In the configuration shown, the data center 600 comprises a first intermediate floor 611 and a second intermediate floor 619 located under the first intermediate floor 611. The first intermediate floor 611 is arranged for carrying IT and/or telecoms equipment 607 and for this purpose may be provided with carrying structures such as server racks 606. In the configuration shown, outside air 601 comes into a distributing space 605, and is then supplied via an intake 602 in the side wall 604 to the cooling space 615. From the cooling space 615, the outside air 601 is led as secondary air flow 618 through several evaporative coolers 617 located on the second intermediate floor 619. In the embodiment shown, the second intermediate floor 619 comprises controllable passages 608, such that the secondary air 618 is then led through the evaporative cooler 617, and is led to a collecting space 609 located under the second intermediate floor 619. Then the secondary air 618 can pass through from the lowest collecting space 609 via a passage 603 provided in a side wall, to a following, essentially vertically installed collecting space 612, where the secondary air flow 618 will leave data center 600 via a discharge opening 613 positioned on the top of the building. The secondary air flow 618 follows a nonlinear path, wherein the direction of flow of the secondary air flow 618 from the evaporative cooler 617 to the lowest collecting space 609 is displaced vertically. The collecting space 609 located under the second intermediate floor 619 is delimited on the underside by a third intermediate floor 610. Opposite sides of the collecting space 609 located under the second intermediate floor 619 and above the third intermediate floor 610 are delimited by side walls and/or partition walls of the building (not shown). A desired height of the data center 600 may be selected by adding several sections in the height direction.

Figure 7:
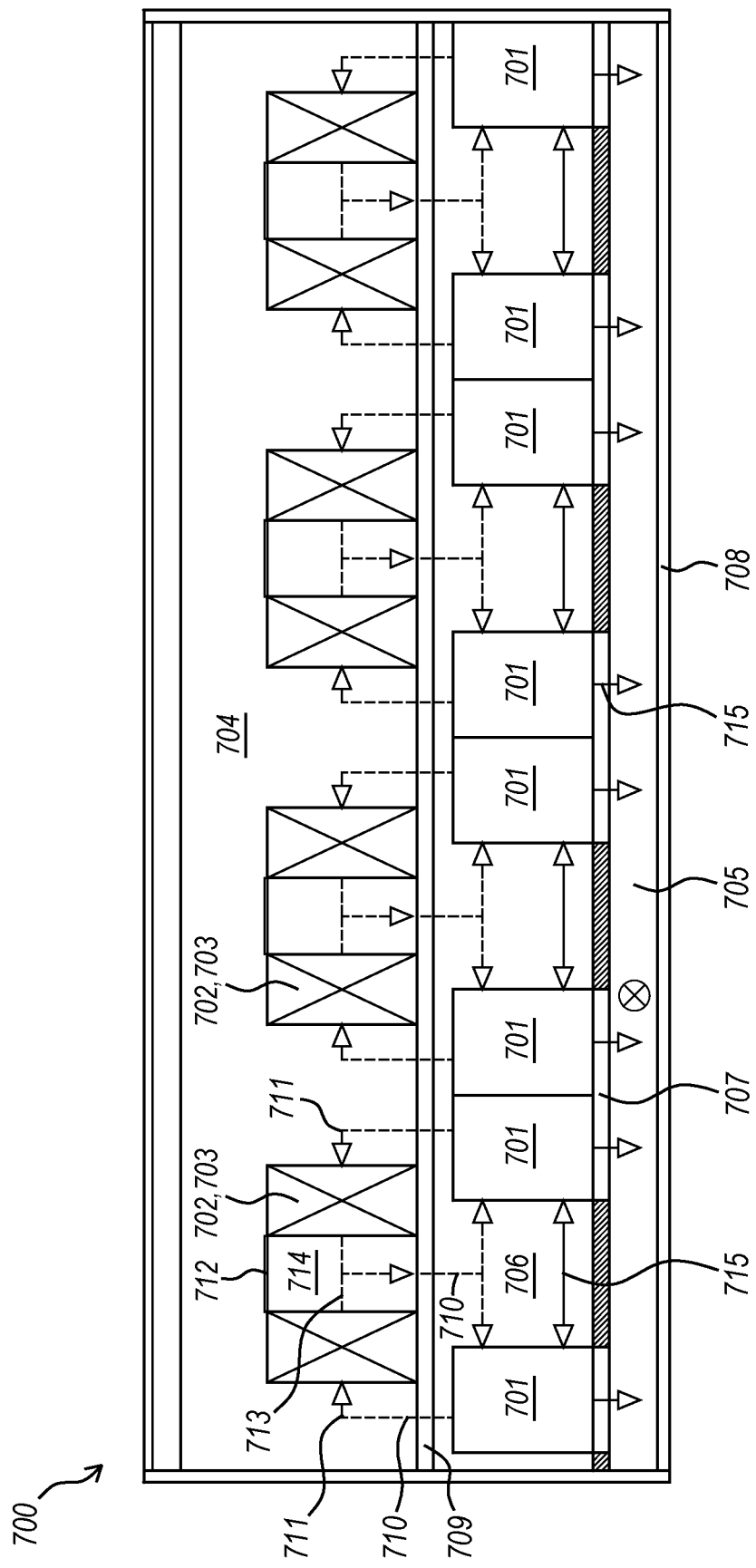
FIG. 7: another cross section of a data center according to the invention, optionally formed by the data center as shown in FIG. 6.

FIG. 7 shows a cross section of a possible embodiment of a data center 700 in the longitudinal direction according to the invention. In the configuration shown, the data center 700 comprises several parallel evaporative coolers 701. Each evaporative cooler 701 is arranged for cooling IT and/or telecoms equipment 703 placed above on the first intermediate floor 709. A primary air flow 710 is conveyed from the evaporative coolers 701 as cooled air 711 to the cooled space 704 via a first intermediate floor 709, as already described in the foregoing, especially in the description of FIG. 2. In the configuration shown, the cooled air 711 is conveyed from outside to two server racks 702, which are connected by means of a covering element 712. The air flows 713 warmed by the IT and/or telecoms equipment 703 form a warm zone 714 enclosed between the covering element 712, the first intermediate floor 709 and the server racks 702. From the warm zone 714, the primary air 710 is returned to the evaporative coolers 701 in the cooling space 706. Indirect cooling of the primary air flow 710 takes place in the evaporative coolers 701, because a secondary air flow 707 is led through the evaporative coolers 701. The primary air flow 710 remains separated from the secondary air flow 715. This secondary air flow 715 consists of outside air drawn in from outside the data center 700, which enters via a side wall of the building of the data center (700). The secondary air flow 715 led through the evaporative coolers 701 is led away via the evaporative coolers 701 installed on the second intermediate floor 707 to a collecting space 705 provided under the second intermediate floor 707 and above the third intermediate floor 708 and is then discharged via a discharge opening in a side wall of the building to the outside air (not shown).

LIST OF REFERENCE NUMBERS

100. Enthalpy-exchanging unit
101. Partition wall
102. Channel
103. Primary air flow
104. Secondary air flow
105. First contact side
106. Second contact side
107. Hygroscopic covering
200. Data center
201. Side wall
202. First intermediate floor
203. Second intermediate floor
204. IT and/or telecoms equipment
205. Server rack
206. Evaporative cooler
207. Fan
208. Primary air flow
209. Cooled air
210. Grating
211. Covering element
212. Cold zone
213. Warmed air
214. Warm zone
215. Secondary air flow
216. Intake
217. Distributing space
218. Inlet
219. Outlet
220. Collecting space
221. Discharge opening
222. Partition wall
223. Controllable passage
224. Door
225. Moistening device
226. Water reservoir
227. Water pipe
228. Air channel
300. Data center
301. Outside air
302. Intake
303. Side wall
304. Distributing space
305. Secondary air flow
306. Evaporative cooler
307. Collecting space
308. Inlet
309. Outlet
310. Partition wall
311. Controllable passage
312. Discharge opening
400. Data center
401. Section
402. Cooling space
403. Cooled space
404. First intermediate floor
405. Server rack
406. IT and/or telecoms equipment
407. Side wall
408. Roof
409. Second intermediate floor
410. Evaporative cooler 411. Outside air
412. Intake
413. Secondary air flow
414. Discharge opening
500. Data center
501. Section
502. Intakes
503. Discharge openings
504. Supply passage
505. Discharge passage
506. Supplementary side wall
601. Data center
602. Outside air
603. Intake
604. Side wall
605. Distributing space
606. Server rack
607. IT and/or telecoms equipment
608. Passage
609. Collecting space
610. Third intermediate floor
611. First intermediate floor
612. Collecting space
613. Discharge opening
614. Fan
615. Cooling space
616. Cooled space
617. Evaporative cooler
618. Secondary air flow
619. Second intermediate floor
700. Data center
701. Evaporative cooler
702. Server rack
703. IT and/or telecoms equipment
704. Cooled space
705. Collecting space
706. Cooling space
707. Second intermediate floor
708. Third intermediate floor
709. First intermediate floor
710. Primary air flow
711. Cooled air
712. Covering element
713. Warmed air
714. Warm zone
715. Secondary air flow It will be clear that the invention is not limited to the embodiment examples presented and described here, but that numerous variants are possible within the scope of the appended claims, which will be obvious to a person skilled in the art. It is conceivable that various inventive concepts and/or technical measures of the embodiment variants described above may be combined completely or partially without departing from the inventive concepts described in the appended claims.

The verb "comprise" and conjugations thereof used in this patent specification mean not only "comprise", but also the expressions "include", "consist essentially of", "formed by", and conjugations thereof.

The invention claimed is:

1. A data center, comprising:
   at least one building, said building comprising one or more side walls,
   at least one, at least partially open first intermediate floor constructed in the building and arranged for carrying IT and/or telecoms equipment, and
   at least one second intermediate floor constructed in the building, located under the at least partially open first intermediate floor, and on said second intermediate floor at least one indirect evaporative cooler is installed, said evaporative cooler being arranged for leading a primary air flow coming from the IT and/or telecoms equipment that is to be cooled and at a distance from the primary air flow to be cooled, leading a secondary air flow that is led via at least one inlet into the evaporative cooler and is led via at least one outlet from the evaporative cooler, wherein the primary air flow and the secondary air flow are separated by means of at least one partition wall, forming part of the evaporative cooler, wherein at least one part of a part of the partition wall facing the secondary air flow is preferably covered with at least one hygroscopic covering, and
   at least one water reservoir arranged for moistening the partition wall, and in particular the hygroscopic covering,
   first air flow generating means for generating the primary air flow, so that the primary air flow is led through the at least one evaporative cooler,
   second air flow generating means for generating the secondary air flow, so that the secondary air flow is led through the at least one evaporative cooler,
   wherein a first side wall of the building is provided with at least one intake for the secondary air flow, wherein a second side wall of the building is provided with a discharge opening for the secondary air flow, wherein the outlet of the at least one evaporative cooler, arranged for directing the secondary air flow from the evaporative cooler, is positioned at a distance from the discharge opening provided in the second side wall of the building, and wherein an essentially closed collecting space for the secondary air flow led through the at least one evaporative cooler is formed between the outlet of the at least one evaporative cooler and the discharge opening provided in the second side wall of the building.

2. The data center as claimed in claim 1, wherein the inlet of the at least one evaporative cooler arranged for leading the secondary air flow into the evaporative cooler is positioned at a distance from the intake provided in the first side wall of the building.

3. The data center as claimed in claim 2, wherein an essentially closed distributing space for the secondary air flow that is to be led through the at least one evaporative cooler is formed between the inlet of the at least one evaporative cooler and the intake provided in the first side wall of the building.

4. The data center as claimed in claim 1, wherein several indirect evaporative coolers are mounted on at least one second intermediate floor.

5. The data center as claimed in claim 4, wherein several indirect evaporative coolers are installed essentially parallel.

6. The data center as claimed in claim 5, wherein the inlet for the secondary air flow of each evaporative cooler of the evaporative coolers installed parallel to one another faces and connects to the distributing space.

7. The data center as claimed in claim 1, wherein the distributing space and the collecting space are separated from one another by at least one partition wall.

8. The data center as claimed in claim 7, wherein at least one partition wall is provided with at least one control valve for mixing the air derived from the collecting space with the air present in the distributing space.

9. The data center as claimed in claim 1, wherein the at least one evaporative cooler is installed in such a way that the secondary air flow is led along a nonlinear path through the data center.

10. The data center as claimed in claim 1, wherein the direction of flow of the secondary air flow through the intake provided in the first side wall of the building and the direction of flow of the secondary air flow in the inlet of the at least one evaporative cooler together enclose an angle, preferably a right angle.

11. The data center as claimed in claim 1, wherein the first air flow generating means and/or the second air flow generating means comprise at least one fan.

12. The data center as claimed in claim 1, wherein each evaporative cooler comprises first air flow generating means and/or second air flow generating means.

13. The data center as claimed in claim 1, wherein the data center comprises first guiding means for directing the primary air flow to be cooled, derived from a warm zone above the first intermediate floor, to at least one evaporative cooler and returning the primary air flow cooled by the at least one evaporative cooler to a cold zone above the first intermediate floor.

14. The data center as claimed in claim 1, wherein the second intermediate floor is of waterproof construction.

15. The data center as claimed in claim 1, wherein the hygroscopic covering of the at least one evaporative cooler is formed by a layer of hygroscopic material, especially a hygroscopic cloth, more especially a hygroscopic woven fabric.

16. The data center as claimed in claim 1, wherein the hygroscopic covering of the at least one evaporative cooler essentially lies loosely against a contact side of the partition wall, so that a film of water can spread unhindered over the whole contact side of the partition wall.

17. The data center as claimed in claim 1, wherein the hygroscopic covering of the at least one evaporative cooler is stretched over the contact side of the partition wall.

18. The data center as claimed in claim 1, wherein the hygroscopic covering surrounds the partition wall of the at least one evaporative cooler on several sides.

19. The data center as claimed in claim 1, wherein the partition wall of the at least one evaporative cooler forms at least one channel, around which the hygroscopic covering is applied.

20. The data center as claimed in claim 1, wherein the first intermediate floor is formed at least partially by at least one grating.

21. The data center as claimed in claim 1, wherein at least one part of the water reservoir is formed by a water pipe.

22. The data center as claimed in claim 1, wherein several first intermediate floors and second intermediate floors are installed alternately above one another in the building.

23. The data center as claimed in claim 1, wherein at least one first intermediate floor is provided with server racks arranged for carrying IT and/or telecoms equipment.

24. The data center as claimed in claim 23, wherein each evaporative cooler is arranged for cooling at least two, preferably at least four server racks located above the associated evaporative cooler.

25. The data center as claimed in claim 1, wherein a collecting space for the secondary air flow that is led through at least one evaporative cooler is provided under the second intermediate floor, wherein the second intermediate floor communicates with the collecting space below.

26. The data center as claimed in claim 1, wherein the data center comprises several buildings that are positioned a distance apart, in such a way that the second side wall of one building is located opposite the second side wall of another building.

27. The data center as claimed in claim 1, wherein the at least one first intermediate floor is provided with IT and/or telecoms equipment.

28. A method for cooling a data center, wherein the method comprises the steps:
   A. leading a secondary air flow via at least one intake provided in a first side wall of a building of the data center into a space above a second intermediate floor of the data center,
   B. leading the secondary air flow through at least one indirect evaporative cooler, and along at least one, preferably moistened, partition wall,
   C. discharging the secondary air flow moistened during step B) via at least one discharge opening provided in a second side wall of a building of the data center,
   D. discharging a primary air flow to be cooled, which is located above a first intermediate floor, and behind IT and/or telecoms equipment placed thereon, via the first intermediate floor located above the second intermediate floor,
   E. leading the primary air flow through the at least one indirect evaporative cooler, and along a side turned away from the secondary air flow of the at least one, preferably moistened, partition wall of the at least one evaporative cooler, wherein the primary air flow is cooled,
   F. returning the cooled primary air flow via the first intermediate floor to a front of the IT and/or telecoms equipment,
   wherein at least steps B) and E) are carried out simultaneously, wherein an outlet of the at least one evaporative cooler, arranged for directing the secondary air flow from the evaporative cooler, is positioned at a distance from a discharge opening provided in a second side wall of the data center, and wherein an essentially closed collecting space for the secondary air flow led through the at least one evaporative cooler is formed between the outlet of the at least one evaporative cooler and the discharge opening provided in the second side wall of the data center.

29. The method as claimed in claim 28, wherein the method comprises step G), comprising moistening the hygroscopic covering of each evaporative cooler by means of at least one water reservoir, wherein step G) is carried out before and/or during step B).

* * * * *